United States Patent [19]

Kizu et al.

[11] Patent Number: 5,212,105
[45] Date of Patent: May 18, 1993

[54] SEMICONDUCTOR DEVICE MANUFACTURING METHOD AND SEMICONDUCTOR DEVICE MANUFACTURED THEREBY

[75] Inventors: Tatsuki Kizu; Shinichi Shimada, both of Yokohama; Kiyoshi Kobayashi, Kawasaki, all of Japan

[73] Assignee: Kabushiki Kaisha Toshiba, Kawasaki, Japan

[21] Appl. No.: 804,506

[22] Filed: Dec. 10, 1991

Related U.S. Application Data

[63] Continuation of Ser. No. 528,205, May 24, 1990, abandoned.

[30] Foreign Application Priority Data

May 24, 1989 [JP] Japan .................................. 1-128652

[51] Int. Cl.$^5$ .......................................... H01L 21/265
[52] U.S. Cl. ........................................ 437/44; 437/41; 437/34; 437/57; 257/327
[58] Field of Search ............... 357/23.3, 23.4, 59; 156/643, 653; 29/571; 437/44, 41, 57, 34

[56] References Cited

U.S. PATENT DOCUMENTS

| | | | |
|---|---|---|---|
| 4,488,351 | 12/1984 | Momose | 29/578 |
| 4,521,448 | 6/1985 | Sasaki | 357/23.3 |
| 4,717,941 | 1/1988 | Yamazaki | 357/23.3 |
| 4,745,086 | 5/1988 | Parrillo et al. | 437/44 |
| 4,753,898 | 6/1988 | Parrillo et al. | 357/23.3 |
| 4,764,477 | 8/1988 | Chang et al. | 437/44 |
| 4,784,965 | 11/1988 | Woo et al. | 357/23.3 |
| 4,808,544 | 2/1989 | Matsui | 357/23.3 |
| 4,818,714 | 4/1989 | Haskell | 357/23.3 |
| 4,868,617 | 9/1989 | Chio et al. | 357/23.3 |
| 4,873,557 | 10/1989 | Kita | 357/23.3 |
| 4,925,807 | 5/1990 | Yoshikawa | 357/23.3 |
| 5,035,622 | 8/1991 | Ishihara | 437/44 |

FOREIGN PATENT DOCUMENTS

| | | |
|---|---|---|
| 88922 | 8/1983 | European Pat. Off. . |
| 127725 | 12/1984 | European Pat. Off. . |
| 218408 | 9/1985 | European Pat. Off. . |
| 3530065 | 3/1985 | Fed. Rep. of Germany . |

Primary Examiner—Brian E. Hearn
Assistant Examiner—Kevin M. Picardat
Attorney, Agent, or Firm—Foley & Lardner

[57] ABSTRACT

A method for manufacturing a semiconductor device comprises the steps of forming a polysilicon spacer on an after-oxide film on a semiconductor substrate, doping the polysilicon spacer by ion-implanting an impurity such as phosphorus, thermally diffusing the impurity into the polysilicon spacer, and eliminating the polysilicon spacer in part by etching. A semiconductor device manufactured by this method is also disclosed.

7 Claims, 2 Drawing Sheets

SEMICONDUCTOR DEVICE MANUFACTURING METHOD AND SEMICONDUCTOR DEVICE MANUFACTURED THEREBY

This application is a continuation, of application Ser. No. 07/528,205, filed May 24, 1990 now abandoned.

BACKGROUND OF THE INVENTION

1. Field of the Invention:

This invention relates to a method for manufacturing a semiconductor device and a semiconductor device manufactured thereby, and more particularly to a method for eliminating a spacer in part on a semiconductor substrate by an etching process, preventing any damage to the semiconductor substrate and gates thereon.

2. Description of the Related Art:

Heretofore, a non-doped polysilicon spacer has been in ordinary use to manufacture a MOS transistor having an LDD structure; such a spacer is formed by forming polysilicon gates on a semiconductor substrate after oxidizing the gates, subsequently, by adding an impurity of a low concentration to the semiconductor substrate and by accumulating polysilicon layer on the after-oxide film.

FIG. 1 shows a semiconductor device manufactured by this conventional method. The semiconductor substrate 4 includes electrode regions 3 of a low impurity concentration. A polysilicon gate 5 is formed on the substrate 4, with a gate oxide film 2 sandwiched between the polysilicon gate 5 and the substrate 4. A non-doped polysilicon spacer 1 is formed over the gate oxide film 2.

The resulting polysilicon spacer 1 is etched by the RIE (reactive ion etching) method and non-doped polysilicon spacers 1 are formed as shown in FIG. 2. Then an impurity of a high concentration is added in the semiconductor substrate. Finally, the polysilicon spacer 1 is further etched by the CDE (chemical dry etching) method to form an LDD structure.

According to the conventional method, however, there has been a disadvantage that the spacer 1 can only be inadequately eliminated in the CDE process due to the composition of the spacer 1. Specifically, since the spacer 1 consists exclusively of a non-doped polysilicon, its etching speed is relatively low. Thus, the difference in etching speed between the polysilicon spacer 1 and the after-oxide film 2 made of $SiO_2$ would be relatively small to adequately eliminate a desired part of the polysilicon spacer 1.

In other words, if a long time is taken for the etching process to adequately eliminate the polysilicon spacer 1, the etching process would excessively proceed so as to partly etch even the oxide film 2, thus producing a damaged portion 2' as shown in FIG. 3. Further, the etching action could occasionally reach the polysilicon gate 5 to damage, thus producing a damage portion 5'.

To the contrary, if the etching time is shortened to avoid such damage, the spacer 1 would be inadequately eliminated, leaving some unnecessary spacer part as shown in FIG. 4. This residual spacer 1 would act as a floating gate which impairs the transistor property. If the polysilicon gate 5 has a reverse-taper shape, this problem is more intense so that more of the spacer is apt to remain.

Therefore, for the desired elimination of the spacer 1, it has heretofore been a common practice to keep the etching time as long as possible to minimize the margin of the spacer 1 to protect the after-oxide film.

Further, since not only the after-oxide film 2 of the gate but also the field oxide film 8 would be etched during the etching of the polysilicon spacer 1, it is necessary to keep a margin of the field oxide film 8 at the stage of designing. This, like the so-called bird's beak, has been an obstacle to the high integration of the semiconductor device.

SUMMARY OF THE INVENTION

It is therefore an object of the present invention to provide a semiconductor device manufacturing method for adequately eliminating the spacer and preventing the gate and the semiconductor substrate from being damaged during the etching process.

Another object of the invention is to provide a semiconductor device which is manufactured by the method described above.

According to the invention, there is provided a method for manufacturing a MOS transistor having an LDD structure, comprising the steps of forming a polysilicon spacer on an after-oxide film on a semiconductor substrate, doping the polysilicon spacer by ion-implanting an impurity such as phosphorus, thermally diffusing the impurity into polysilicon spacer, and forming two layers of after-oxide film on the semiconductor substrate by two separate after-oxidization processes under different conditions.

By this method, the time for etching the phosphorus-doped polysilicon spacer can be reduced nearly half the time for etching the semiconductor substrate so that the polysilicon spacer can be adequately eliminated without damaging the after-oxide film.

Many other advantages, features and additional objects of the present invention will become manifest to those skilled in the art upon making reference to the detailed description and the accompanying drawings in which certain preferred embodiments of the present invention are shown by way of illustrative example.

DETAILED DESCRIPTION OF THE EMBODIMENTS

Figure 5:
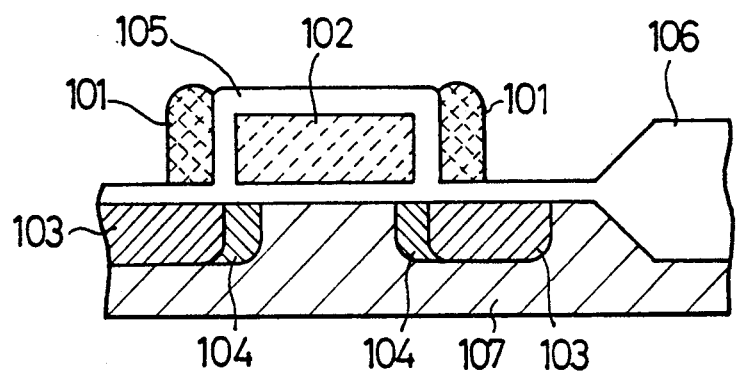
FIG. 5 is a fragmentary cross-sectional view of a semiconductor device, showing one of manufacturing steps according to a first embodiment of the present invention.

The principles of the present invention are particularly useful when embodied in a semiconductor device such as shown in FIG. 5.

Figure 1:
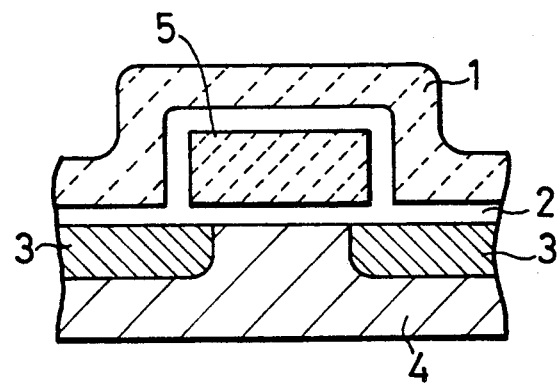
FIG. 1 is a fragmentary cross-sectional view of a semiconductor device in which a polysilicon spacer has been formed according to a conventional method.
Figure 2:
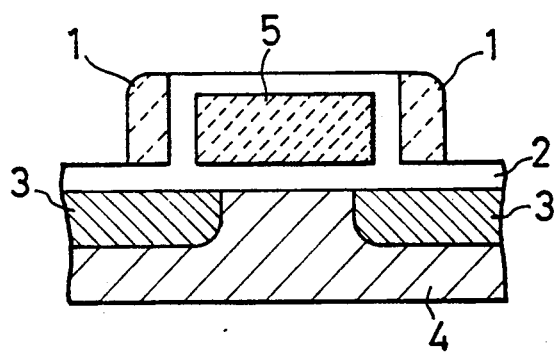
FIG. 2 is a view similar to FIG. 1, showing the semiconductor device in which the polysilicon spacer has been ideally etched.
Figure 3:
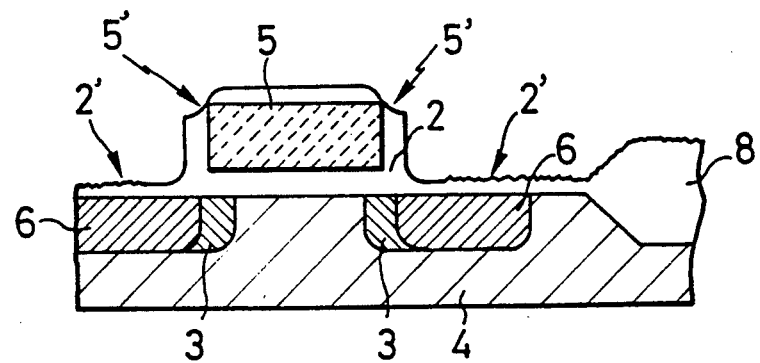
FIG. 3 shows a conventional art problem with the semiconductor device of FIG. 2 in which the after-oxide film can be damaged during the etching process.
Figure 4:
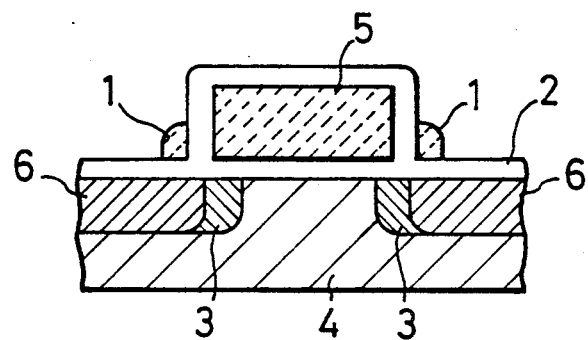
FIG. 4 is a view similar to FIG. 3, showing another conventional problem in which the unnecessary part of the spacer of FIG. 2 can be eliminated only incompletely.

In FIG. 5, a polysilicon spacer 101 is formed on a semiconductor substrate so as to define electrode regions of a high impurity concentration. The polysilicon spacer is deposited on an oxide film 105 formed on a semiconductor substrate 107, similarly to a polysilicon spacer 1 formed in the conventional process shown in FIG. 1. According to the present invention, the polysilicon spacer 101 is added with phosphorus by ion-implantation (P-doped) and is annealed by using $N_2$ so as to thermally diffuse phosphorus. Thereafter, the polysilicon spacer 101 is etched by RIE (reactive ion etching), so that p-doped polysilicon spacer 101 will be formed, as shown in FIG. 5.

When an N-channel transistor is to be made, the after-oxide film 105 is formed first, and phosphorus ions are ion-implanted to the substrate to form electrode regions 104 having a low impurity concentration. Thus, the P-doped polysilicon spacer 101 will be formed. Thereafter, arsenic ions are ion-implanted into the substrate 107 to form electrode regions 103 having a high impurity concentration, so that the N-channel transistor having the LDD structure will be formed.

The etching time to eliminate the p-doped polysilicon spacer will be reduced half the time required to eliminate non-doped polysilicon spacer. As a result, the scraping depth of the after-oxide film 105 and the field oxide film 106 will be reduced nearly half compared with the conventional method.

Figure 6:
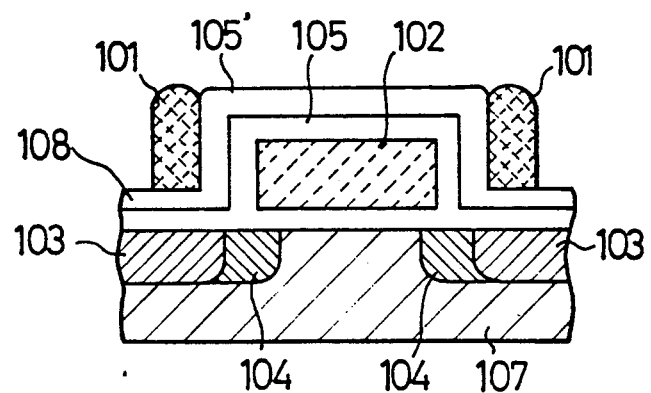
FIG. 6 is a view similar to FIG. 5, showing one of the manufacturing steps according to a second embodiment.

FIG. 6 shows another embodiment of the present invention, in which after-oxidization process is applied twice to form a first after-oxide film 105 and a second after-oxide film 105' prior to forming a P-doped polysilicon spacer 101. The first after-oxide film 105 is made dense by applying thereto dry $O_2$ of 900° so as to prevent the oxide film from being shaped like a bird's beak. The second oxide film 105' is subject to BOX-oxidization at 850° in order to increase the thickness of the oxide film in the vicinity of the polysilicon gate. As a result, even when the polysilicon film is as thick as the polysilicon film of the prior art, the process margin can be increased substantially, thereby preventing the semiconductor substrate from being damaged during the etching process to form the polysilicon spacer.

In the illustrated embodiments, the polysilicon spacer is doped by ion-implanting phosphorus ions and annealed by using $N_2$ by way of example. Phosphorus also can be diffused by using $POCl_3$. In the second embodiment, the after-oxidization process is separately carried out twice, but can be performed in series.

According to the present invention, the P-doped polysilicon spacer can be etched at a speed which is fast about two times the speed of the etching process applied to the non-doped polysilicon spacer. In addition, the scraped depth of the after-oxide film and the field oxide film will be reduced to half the depth to be scraped in the convectional method. As a result, the process margin will be increased, which will enable semiconductor devices to be manufactured as economically and efficiently as possible.

In addition, the field oxide film is protected against any damage caused by the etching process, with the result that the semiconductor device is susceptible to high integration.

What is claimed is:

1. A method of manufacturing semiconductor devices comprising:

forming a gate insulating film on the surface of a semiconductor substrate, within which substrate lightly doped impurity regions are formed;

forming a gate electrode on said gate insulating film;

forming an impurity polysilicon layer on said substrate over said gate electrode, the density of the impurity introduced in said polysilicon being sufficiently high to increase the etching speed of said polysilicon layer;

selectively removing said impurity polysilicon layer by anisotropic etching in order to leave polysilicon spacers flanked on the side surface of said gate electrode;

introducing an impurity into said impurity regions by the use of said gate electrode and said spacers as masks in order to form heavily doped impurity regions in said lightly doped impurity regions, respectively; and removing said spacers by selective etching.

2. The method of claim 1, wherein said impurity polysilicon layer is formed by the deposition of polysilicon followed by ion implantation.

3. The method of claim 2, wherein said impurity polysilicon layer is a polysilicon layer into which phosphorous has been introduced.

4. The method of claim 3, wherein said impurity polysilicon layer is thermally annealed after the introduction of phosphorous.

5. The method of claim 1 further comprising the step of forming a silicon oxide film on said gate electrode prior to the formation of said polysilicon layer.

6. The method of claim 5 wherein said silicon oxide film is formed as a dual film consisting of first and second silicon oxide films.

7. The method of claim 6 wherein said first silicon oxide film is formed by thermal treatment in a dry oxygen atmosphere whereas said second silicon oxide film is formed by BOX oxidation.

* * * * *